(12) United States Patent
Yang

(10) Patent No.: US 6,281,055 B1
(45) Date of Patent: Aug. 28, 2001

(54) METHOD OF FABRICATING A THIN FILM TRANSISTOR

(75) Inventor: Joon-Young Yang, Pucheon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/286,564

(22) Filed: Apr. 5, 1999

(30) Foreign Application Priority Data

Apr. 7, 1998 (KR) .................................................. 98-12205

(51) Int. Cl.$^7$ .......................... H01L 21/00; H01L 21/336
(52) U.S. Cl. ............................ 438/151; 438/162; 438/308
(58) Field of Search ................................. 438/299, 151, 438/517, 308, 162

(56) References Cited

U.S. PATENT DOCUMENTS

| | | |
|---|---|---|
| 5,512,494 * | 4/1996 | Tanabe .................................... 437/21 |
| 5,620,906 | 4/1997 | Yamaguchi et al. . |
| 5,897,346 * | 4/1999 | Yamaguchi et al. .................. 438/162 |
| 5,956,581 * | 9/1999 | Yamazaki et al. .................... 438/166 |

\* cited by examiner

*Primary Examiner*—Olik Chaudhuri
*Assistant Examiner*—Shrinivas H. Rao
(74) *Attorney, Agent, or Firm*—Long, Aldridge & Norman LLP

(57) ABSTRACT

A method of fabricating a TFT includes a step of forming an impurity region for a source and a drain by simultaneously implanting and activating impurity ions. More particularly, the present invention includes the steps of forming a gate insulating layer and a gate on a predetermined and selected portion of an active layer, forming an excited region in the exposed portion of the active layer by implanting hydrogen ions to the active layer by using the gate as a mask, and forming an impurity region by implanting impurity ions heavily to the excited region which remains in an excited state.

19 Claims, 3 Drawing Sheets

METHOD OF FABRICATING A THIN FILM TRANSISTOR

This application claims the benefit of Korean Patent Application No. 1998-12205, filed on Apr. 7, 1998, which is hereby incorporated by reference.

BACKGROUND OF THE INVENTION

1. Field of the Invention

The present invention relates to a method of fabricating a thin film transistor formed by doping an active layer with impurities by using a gate as a mask and by forming a source and a drain by activating the impurities.

2. Discussion of the Related Art

FIGS. 1A–1C show cross-sectional views of a TFT structure which illustrates a method for fabricating a thin film transistor (hereinafter abbreviated TFT) according to a related art.

In FIG. 1A, an insulating or buffer layer 13 is formed by depositing an insulating substance, such as silicon dioxide, on a transparent substrate 11, such as a glass substrate or the like, with Chemical Vapor Deposition (hereinafter abbreviated CVD). An active layer 15 is formed by depositing polycrystalline silicon on the buffer layer 13 with CVD. Next, the active layer 15 is patterned by photolithography to be etched on a predetermined portion of the buffer layer 13.

According to FIG. 1B, another layer of silicon dioxide is now grown or deposited across the surface of the silicon wafer. Using similar lithographic techniques to those described above, holes are etched through the silicon dioxide in areas in which it is desired to make the connections and metallization layer of aluminum interconnections are deposited. In other words, after the silicon dioxide layer covers the active layer 15, a conductive material such as Aluminum, metal, or the like is deposited on the silicon dioxide layer by the CVD process.

A gate insulating layer 17 and a gate 19 are formed by patterning the conductive material and the silicon dioxide layer by photolithography so that they remain over a selected portion of the active layer 15.

Subsequently, ion-implanted region 21, constituting source and drain regions, is formed by heavily doping an exposed surface of the active layer 15 with impurities such as Phosphorous (P), Arsenic (AS), or the like, by using the gate 19 as a mask.

Referring to FIG. 1C, the impurities implanted in the ion-implanted region 21 are activated by application of a laser beam onto the region 21. Consequently, an impurity region 23 constituting a source and a drain is formed as the impurity ions in the region 21 are activated by the laser beam.

However, as the above-described method of fabricating a TFT according to the related art reveals, this process involves complicated steps, such as irradiation of the impurity region with a laser beam to form a source and a drain region and activation of the implanted impurity ions.

The use of laser beams are costly, not very feasible, and can significantly increase the risk of structural damage to the semiconductor layers because of its heat treatment intensity.

SUMMARY OF THE INVENTION

Accordingly, the present invention is directed to a method of fabricating a thin film transistor that substantially obviates one or more of the problems due to the limitations and disadvantages of the related art.

The object of the present invention is to provide a method of fabricating a TFT including the step of simultaneously forming an impurity region for a source and a drain region and the step of implanting and activating the impurity ions in such impurity region.

Additional features and advantages of the invention will be set forth in the description which follows and in part become apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of fabricating a thin film transistor comprises the steps of forming a gate insulating layer on the active layer; forming a gate on the gate insulating layer; forming an excited region in an exposed portion of the active layer by implanting hydrogen ions to the active layer by using the gate as a mask; and forming an impurity region by heavily implanting impurity ions to said excited region while the excited region remains in an excited state.

It is understood that the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the present invention and constitute part of this application, illustrate embodiments of the invention and in conjunction with the description serve to explain the principles of the invention.

DETAILED DESCRIPTION OF THE PREFERRED EMBODIMENTS

Reference will now be made in detail to the preferred embodiment of the present invention, an example of which is illustrated in the accompanying drawings.

Figure 1A:
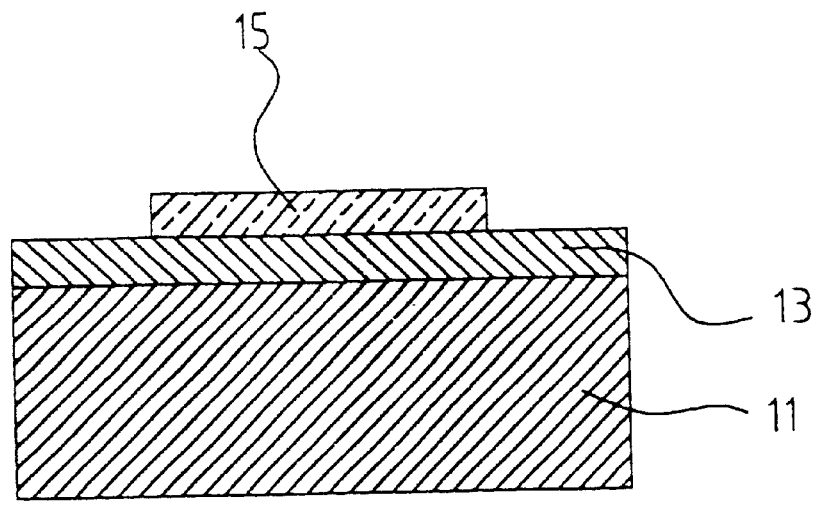
FIGS. 1A–1C illustrate cross-sectional views of a TFT electrode structure, illustrating the method for fabricating a TFT according to a related art.
Figure 1B:
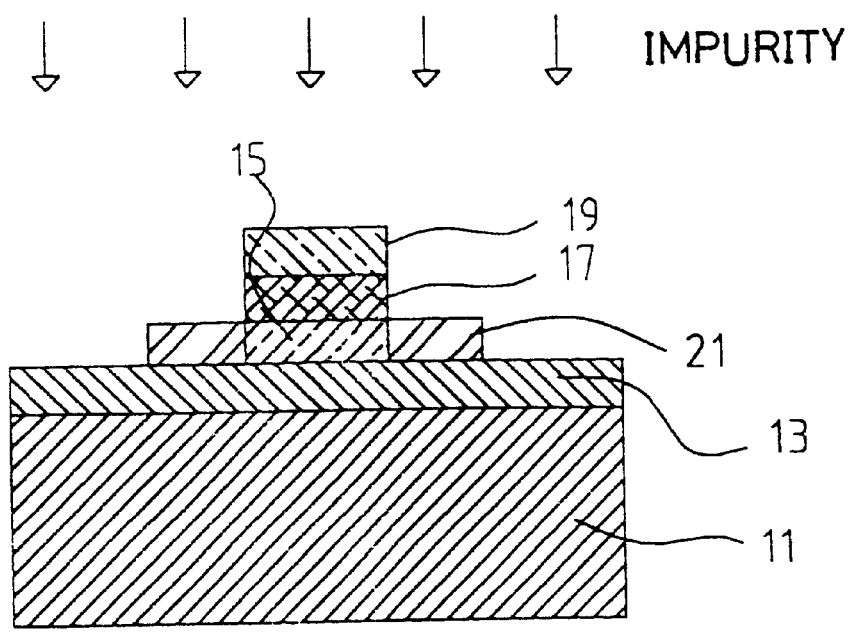
Figure 1C:
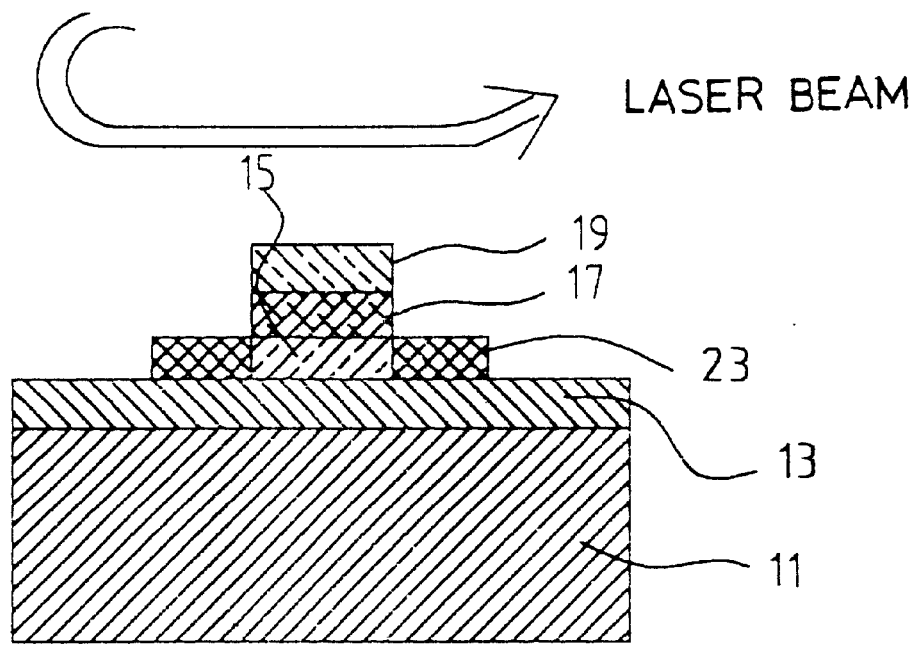
Figure 2A:
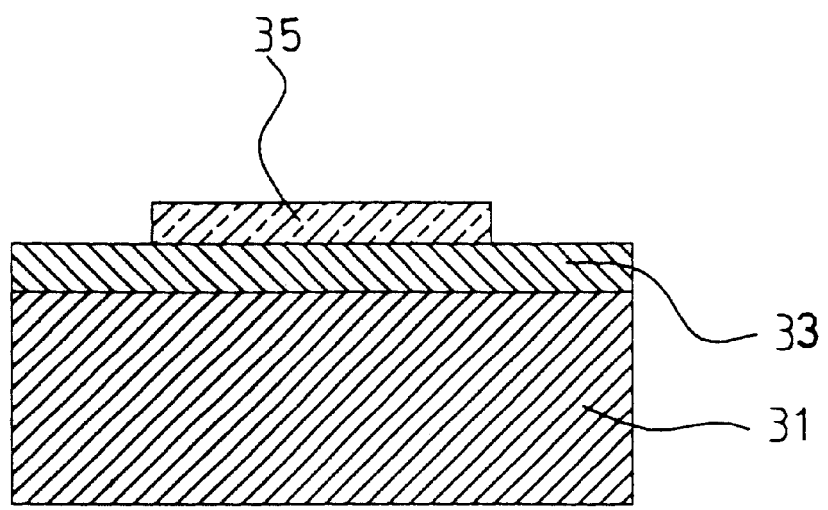
FIGS. 2A–2C illustrate cross-sectional views of a TFT electrode structure, illustrating the method for fabricating a TFT according to the present invention.
Figure 2B:
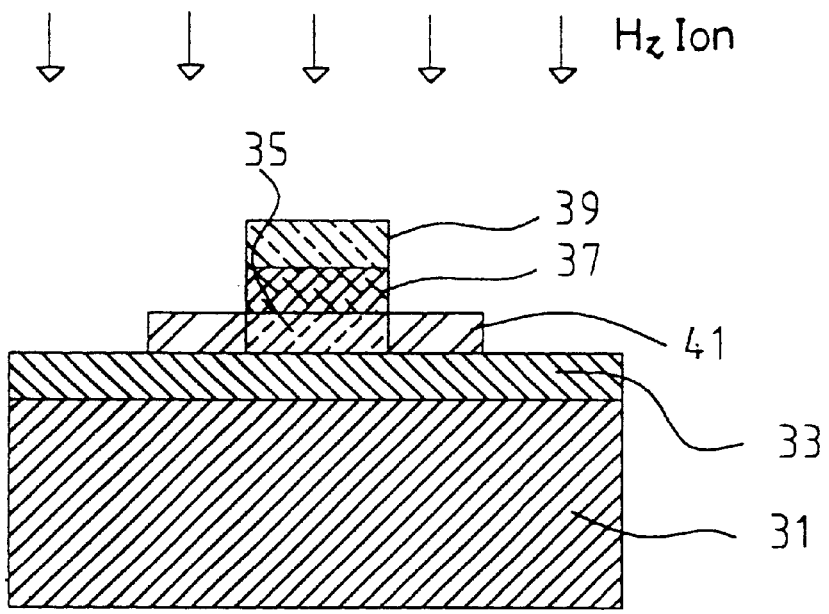
Figure 2C:
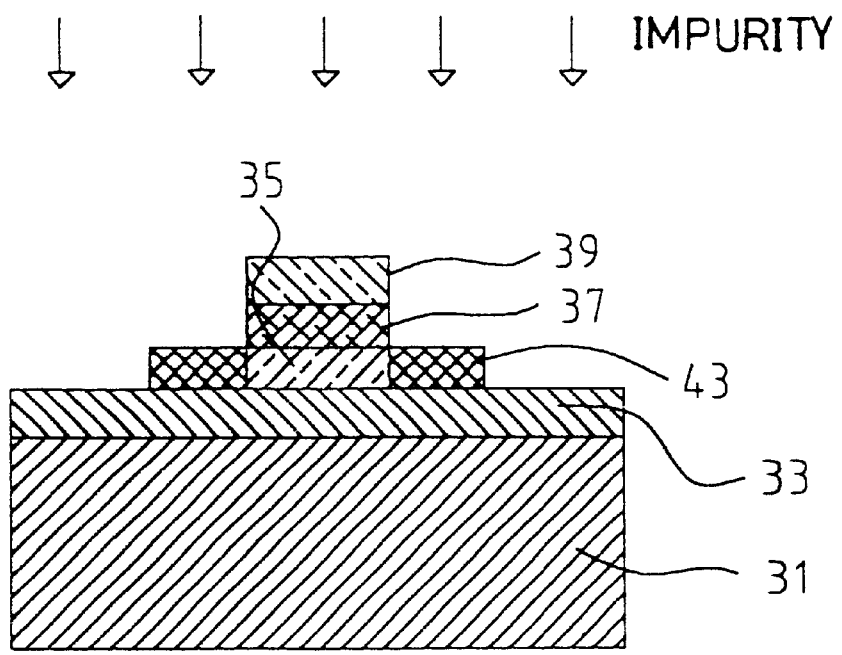

FIGS. 2A–2C show cross-sectional views of a staggered-electrode or top-gate structure illustrating a method for fabricating a TFT according to the present invention.

Referring to FIG. 2A, a buffer layer 33 is formed by depositing silicon dioxide or silicon nitride on a transparent substrate 31, such as a glass substrate or the like, using CVD techniques. An active layer 35 is formed by depositing undoped polycrystalline silicon on the buffer layer 33 to a thickness between about 400 and 800 Å using CVD techniques or other suitable technique known to one or ordinary skill in the art. The active layer 35 is patterned by photolithography so that it remains on a predetermined portion of the buffer layer 33.

Alternatively, rather than forming the active layer 35 by depositing undoped polycrystalline silicon, the active layer 35 may be formed by depositing undoped amorphous silicon using a CVD process and thereafter crystallizing the amorphous silicon with laser annealing or other suitable process known to one or ordinary skill in the art.

As illustrated in FIG. 2B, another layer of an insulating layer, namely, silicon dioxide, is deposited on the buffer layer 33 to cover the active layer 35, and a conductive material, such as Aluminum or the like, is deposited on the silicon dioxide by using CVD. A gate insulating layer 37 and a gate 39 are formed by patterning or etching the conductive material and the silicon dioxide by photolithography so that the insulating layer 37 and gate 39 are formed over a certain portion of the active layer 35. Preferably, the gate insulating layer 37 and the gate 39 are formed to a thickness of about 500~1500 Å and about 1500~2500 Å, respectively.

In a preferred embodiment, after the unwanted portions of the insulating layer 37 are removed, the active layer 35 is doped by ion implantation, wherein hydrogen ions are directed at the wafer, with implantation energy between about 50 and 150 KeV and with a dose of about $5 \times 10^{14}$–$5 \times 10^{16}$ ions/cm$^2$, to alter the type and conductivity of the silicon in the desired regions.

The optimal temperature for impurity doping according to the preferred embodiment is a temperature in the range of about 200–300 degrees Celsius. In the preferred embodiment, as the active region 35 increases, the time necessary for hydrogen ion implantation correspondingly increases in order to achieve the temperature range between about 200 to 300 degrees Celsius. Therefore, the size of the active region or layer is proportionately related to the hydrogen implantation time required to achieve an optical temperature.

Similarly, if the implantation energy of the hydrogen ion implantation increases, the active layer 35 heats up more rapidly.

As the implanted ions collide with the exposed surface of the active layer 35, the kinetic energy of the hydrogen ions yields thermal energy. Subsequently, the exposed surface of the active layer 35 collided with the implanted hydrogen ions is heated to the optimal temperature range falling between about 200~300 degrees Celsius, thereby forming an excited region 41, as illustrated in FIG. 2B. As the size of the hydrogen particle is significantly small, the excited region is not damaged by the collision with implanted hydrogen particles.

According to FIG. 2C, a heavily-doped impurity region 43, which also constitutes source and drain regions, is formed by heavily doping the excited region 41 which remains in an excited state with n-typed impurities, such as P, AS, and the like. Here, the impurities are implanted in the region 41 with a heavy dose preferably between about $1 \times 10^{15}$ and $1 \times 10^{16}$ ions/cm$^2$.

The implanted n-typed impurity ions, once implanted into the active layer, become self-activated as the mobility of each ion particle is increased by the state of excitation of the excited region 41. In other words, as the excited region 41 is implanted with n-typed impurities, it simultaneously becomes activated so as to quickly and efficiently yield a heavily-doped impurity region.

In short, an n-typed TFT is formed by doping the impurity region with n-typed impurity ions. In comparison, a p-typed TFT is fabricated by doping the same region with p-typed impurities, such as Boron (B), BF$_2$, and the like.

As explained in the foregoing description, when hydrogen ions are implanted into an active layer, such implantation heats the exposed surface of the active layer, thereby forming an excited region. Then, impurity ions are implanted into the excited region, forming a heavily-doped impurity region by self-activation of the implanted impurities.

Accordingly, the present invention requires no costly activation equipment and does not require the additional step of laser annealing since the impurity region for source and drain regions is formed by simple, single, and straightforward step of implanting and activating impurity ions simultaneously, which accomplishes both (1) impurity doping; and (2) impurity ion activation.

It will be apparent to those skilled in the art that various modifications and variations can be made in the method of fabricating a thin film transistor of the present invention without departing from the spirit or scope of the inventions. Thus, it is intended that the present invention covers the modifications and variations of this invention provided they come within the scope of the appended claims and equivalents.

What is claimed is:

1. A method of fabricating a thin film transistor, comprising the steps of:

forming a gate insulating layer having a thickness of between 500–1500 Å on an active layer having a thickness between 400 and 800 Å;

forming a gate on said gate insulating layer;

forming an excited region in an exposed portion of said active layer by implanting hydrogen ions into said active layer using said gate as a mask, wherein said hydrogen ions are implanted with an implantation energy between 50 and 150 KeV; and forming an impurity region by implanting impurity ions into said excited region while said excited region remains in an excited state.

2. The method of claim 1, wherein said gate insulating layer is formed by depositing silicon dioxide or silicon nitride on a glass substrate.

3. The method of claim 1, wherein said active layer is formed by depositing undoped polycrystalline silicon.

4. The method of claim 3, wherein said active layer is formed using chemical vapor deposition.

5. The method of claim 1, wherein said active layer is formed by depositing amorphous silicon and then crystallizing said amorphous silicon by laser annealing.

6. The method of claim 1, wherein said hydrogen ions are implanted with a dose of between about $5 \times 10^4$–$5 \times 10^{16}$ ions/cm$^2$.

7. The method of claim 1, wherein said hydrogen ions are implanted so as to heat said excited region to a temperature between 200 and 300 degrees Celsius.

8. The method of claim 1, wherein said hydrogen ions are implanted into said active layer and simultaneously form said impurity region.

9. The method of claim 1, wherein a hydrogen ion implantation time is related to said thickness of said active layer.

10. A thin film transistor prepared by the steps of:

forming a gate insulating layer having a thickness of between 500–1500 Å on an active layer having a thickness between 400 and 800 Å;

forming a gate on said gate insulating layer;

forming an excited region in an exposed portion of said active layer by implanting hydrogen ions into said active layer using said gate as a mask, wherein said hydrogen ions are implanted with an implantation energy between 50 and 150 KeV; and forming an impurity region by implanting impurity ions into said excited region while said excited region remains in an excited state.

11. A thin film transistor prepared according to claim 10, wherein said gate insulating layer is formed by depositing silicon dioxide or silicon nitride on a glass substrate.

12. A thin film transistor prepared according to claim 10, wherein said active layer is formed by depositing undoped polycrystalline silicon.

13. A thin film transistor prepared according to claim 12, wherein said active layer is formed using chemical vapor deposition.

14. A thin film transistor prepared according to claim 12, wherein said active layer is formed by depositing amorphous silicon and the crystallizing said amorphous silicon by laser annealing.

15. A thin film transistor prepared according to claim 10, wherein said hydrogen ions are implanted with a dose of between about $5 \times 10^{14} - 5 \times 10^{16}$ ions/cm$^2$.

16. A thin film transistor prepared according to claim 10, wherein said hydrogen ions are implanted so as to heat said excited region to a temperature between 200 and 300 degrees Celsius.

17. A thin film transistor prepared according to claim 10, wherein said hydrogen ions are implanted into said active layer and simultaneously form said impurity region.

18. A thin film transistor prepared according to claim 10, wherein a hydrogen ion implantation time is proportionately related to said thickness of said active layer.

19. A thin film transistor prepared according to claim 10, wherein said gate insulating layer is formed by depositing silicon dioxide or silicon nitride on a glass substrate, and said active layer is formed by depositing undoped polycrystalline silicon.

* * * * *